United States Patent
Lee et al.

(10) Patent No.: US 10,782,813 B2
(45) Date of Patent: Sep. 22, 2020

(54) DISPLAY DEVICE AND FABRICATING METHOD THEREOF

(71) Applicant: Samsung Display Co., Ltd., Yongin-Si, Gyeonggi-Do (KR)

(72) Inventors: Hyeon Bum Lee, Yongin-si (KR); Hyoeng Ki Kim, Yongin-si (KR); Kwang Woo Park, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/259,747

(22) Filed: Jan. 28, 2019

(65) Prior Publication Data

US 2019/0361555 A1  Nov. 28, 2019

(30) Foreign Application Priority Data

May 28, 2018 (KR) .................. 10-2018-0060586

(51) Int. Cl.
| | | |
|---|---|---|
| *G06F 3/041* | (2006.01) | |
| *G06F 3/044* | (2006.01) | |
| *H01L 27/32* | (2006.01) | |
| *H01L 51/50* | (2006.01) | |

(Continued)

(52) U.S. Cl.
CPC ...... *G06F 3/0412* (2013.01); *G02F 1/133514* (2013.01); *G02F 1/133528* (2013.01); *G06F 3/044* (2013.01); *H01L 27/322* (2013.01); *H01L 27/323* (2013.01); *H01L 27/3211* (2013.01); *H01L 27/3246* (2013.01); *H01L 27/3258* (2013.01); *H01L 51/5012* (2013.01);
(Continued)

(58) Field of Classification Search
CPC ...... G06F 3/041–048; G06F 2203/041–04114; G06F 3/0412; G06F 3/044; G06F 3/0443; G02F 1/13394; G02F 2201/123; G02F 1/13338; G02F 1/133528; G02F 1/133514; H01L 27/3246; H01L 51/525
See application file for complete search history.

(56) References Cited

U.S. PATENT DOCUMENTS

| | | |
|---|---|---|
| 9,229,563 B2 | 1/2016 | Park |
| 9,612,621 B2 | 4/2017 | Lee et al. |
| 9,696,835 B2 | 7/2017 | Her |

(Continued)

FOREIGN PATENT DOCUMENTS

| | | |
|---|---|---|
| KR | 10-2014-0099133 A | 8/2014 |
| KR | 10-2015-0020929 A | 2/2015 |

(Continued)

*Primary Examiner* — Sanjiv D. Patel
(74) *Attorney, Agent, or Firm* — Innovation Counsel LLP

(57) ABSTRACT

A display device may include: a substrate including an emission region and a non-emission region; at least one transistor disposed on the substrate; a display element layer including a light emitting element disposed to correspond to the emission region and a spacer disposed to correspond to the non-emission region; and a touch sensor disposed on the display element layer. The touch sensor may include a base layer including a sensing region and a non-sensing region, a plurality of touch electrodes provided in the sensing region, and an insulating pattern disposed to correspond to the spacer. The insulating pattern and the spacer may have the same thickness. Some of the touch electrodes may be disposed on the insulating pattern.

20 Claims, 13 Drawing Sheets

(51) Int. Cl.
*H01L 51/52* (2006.01)
*G02F 1/1335* (2006.01)

(52) U.S. Cl.
CPC ............. *H01L 51/5281* (2013.01); *G06F 2203/04103* (2013.01); *H01L 2227/323* (2013.01)

(56) References Cited

U.S. PATENT DOCUMENTS

| | | |
|---|---|---|
| 9,941,485 B2 | 4/2018 | Lee et al. |
| 2014/0183478 A1* | 7/2014 | Lee .................. H01L 51/56 257/40 |
| 2016/0202814 A1* | 7/2016 | Lee .................. G06F 3/044 345/173 |
| 2016/0259487 A1 | 9/2016 | Hong et al. |
| 2018/0061898 A1* | 3/2018 | Oh .................. H01L 27/322 |
| 2018/0190720 A1* | 7/2018 | Yueh .................. H01L 27/323 |

FOREIGN PATENT DOCUMENTS

| | | |
|---|---|---|
| KR | 10-1493412 B1 | 2/2015 |
| KR | 10-2015-0069712 A | 6/2015 |
| KR | 10-2016-0107414 A | 9/2016 |
| KR | 10-2017-0075876 A | 7/2017 |
| KR | 10-2018-0025022 A | 3/2018 |

\* cited by examiner

DISPLAY DEVICE AND FABRICATING METHOD THEREOF

CROSS-REFERENCE TO RELATED APPLICATION

The present application claims priority under 35 U.S.C. § 119(a) to Korean patent application 10-2018-0060586 filed on May 28, 2018 in the Korean Intellectual Property Office, the entire disclosure of which is incorporated herein by reference.

BACKGROUND

1. Technical Field

One or more aspects of embodiments of the present disclosure are directed toward a display device and a fabricating method thereof.

2. Related Art

Recently, display devices have been developed to include an information input function in addition to an image display function. The information input function of the display device may be generally implemented with a touch sensor for receiving a touch input by a user.

The touch sensor may be attached to one surface of a display panel for displaying an image, or may be integrally formed with the display panel. A user may input information by pressing or touching the touch sensor while viewing an image displayed in the display panel.

SUMMARY

Embodiments provide a display device having a touch sensor for implementing a uniform touch recognition rate.

Embodiments also provide a fabricating method of the display device.

According to an aspect of the present disclosure, there is provided a display device including: a substrate including an emission region and a non-emission region; at least one transistor disposed on the substrate; a display element layer including a light emitting element disposed to correspond to the emission region and a spacer disposed to correspond to the non-emission region; and a touch sensor disposed on the display element layer, wherein the touch sensor includes a base layer including a sensing region and a non-sensing region, a plurality of touch electrodes provided in the sensing region, and an insulating pattern disposed to correspond to the spacer, wherein the insulating pattern and the spacer have a same thickness, wherein some of the plurality of touch electrodes are disposed on the insulating pattern.

The insulating pattern may include an organic insulating layer or an inorganic insulating layer.

The touch sensor may further include an insulating layer covering some of the plurality of touch electrodes.

The insulating pattern may be integrally provided with the insulating layer.

In the insulating layer, a thickness of a region that corresponds to the spacer may be larger than a thickness of another region that does not correspond to the spacer.

The touch electrodes may include: a touch electrode row including a plurality of first touch electrodes extending along a first direction; a touch electrode column including a plurality of second touch electrodes extending along a second direction intersecting the first direction; a first connection pattern connecting one first touch electrode to an adjacent first touch electrode; and a second connection pattern connecting one second touch electrode to an adjacent second touch electrode, wherein the first touch electrodes, the second touch electrodes, and the second connection pattern are disposed on the first connection pattern with the insulating layer interposed therebetween.

At least one of the first touch electrodes, the second touch electrodes, and the second connection pattern may be disposed on the insulating pattern to have a protruding surface.

The insulating pattern may be disposed on the insulating layer. The insulating pattern and the insulating layer may include different materials. The insulating pattern and the insulating layer may include a same material.

The display element layer may further include a pixel defining layer disposed between adjacent emission regions. The spacer may be disposed on the pixel defining layer.

The light emitting element may include: a first electrode connected to the transistor; an emitting layer disposed on the first electrode; and a second electrode disposed on the emitting layer. The second electrode may have a protruding surface in a region corresponding to the spacer.

The display device may further include a color conversion layer disposed on the touch sensor.

The display device may further include a polarizing film disposed on the touch sensor. The display device may further include an anti-reflection pattern disposed over the insulating pattern.

According to an aspect of the present disclosure, there is provided a method of fabricating a display device, the method including: preparing a substrate including an emission region and a non-emission region; forming at least one transistor on the substrate; forming a display element layer on the substrate, wherein the display element layer includes the at least one transistor, a light emitting element disposed to correspond to the emission region and a spacer disposed to correspond to the non-emission region; and forming a touch sensor on the display element layer. The forming of the touch sensor may include: preparing a base layer including a sensing region and a non-sensing region; forming a first connection pattern on the base layer; forming, over the first connection pattern, an insulating layer including an insulating pattern disposed to correspond to the spacer; and forming, on the insulating layer, first touch electrodes extending along a first direction, second touch electrodes extending along a second direction intersecting the first direction, and a second connection pattern connecting one second touch electrode to an adjacent second touch electrode. Some of the second touch electrodes may be disposed on the insulating pattern. The insulating pattern and the spacer may have a same thickness. The forming of the insulating layer may include: forming an insulating material layer on the base layer including the first connection pattern; forming, using a halftone mask, a photoresist layer on the insulating material layer and then forming a photoresist pattern in which a thickness of a region that corresponds to the spacer is thicker than a thickness of a region that does not correspond to the spacer; and etching the insulating material layer using the photoresist pattern as a mask, wherein, in the insulating layer, a region that corresponds to the spacer has a shape protruding further in a vertical direction than a region that does not correspond to the spacer, wherein the insulating pattern includes a shape protruding from the insulating layer.

The insulating pattern and the insulating layer may be integrally provided. The insulating pattern may include an organic insulating layer or an inorganic insulating layer.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
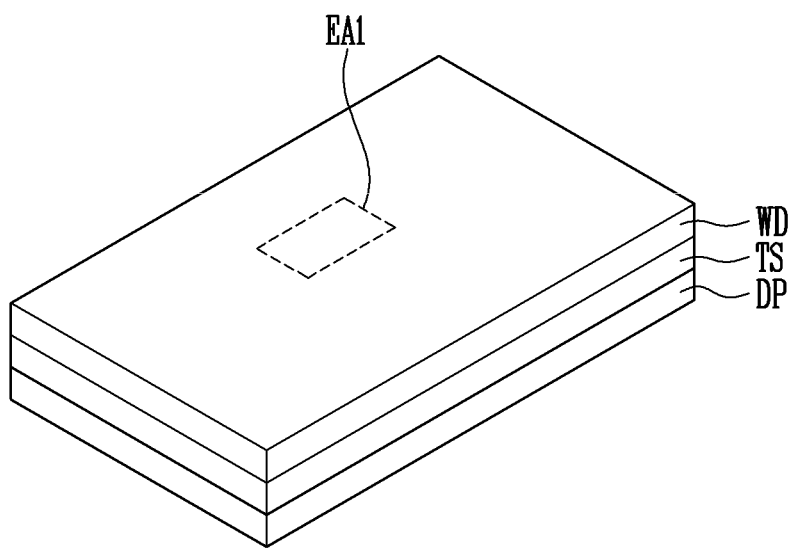
FIG. 1 is a perspective view illustrating a display device according to an embodiment of the present disclosure.

In light of the present disclosure, embodiments of the present disclosure may be applied with various changes and different shapes within the scope or spirit of the present disclosure. Therefore, the illustrated examples do not limit the present disclosure to the depictedshapes and allow substitution of equivalent materials within the scope and spirit of the present disclosure.

Like numbers refer to like elements throughout. In the drawings, the thickness of certain lines, layers, components, elements or features may be exaggerated for clarity. It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the present disclosure. As used herein, the singular forms are intended to include the plural forms as well, unless the context clearly indicates otherwise.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

Hereinafter, embodiments of the present disclosure will be described in detail with reference to the accompanying drawings.

Figure 2:
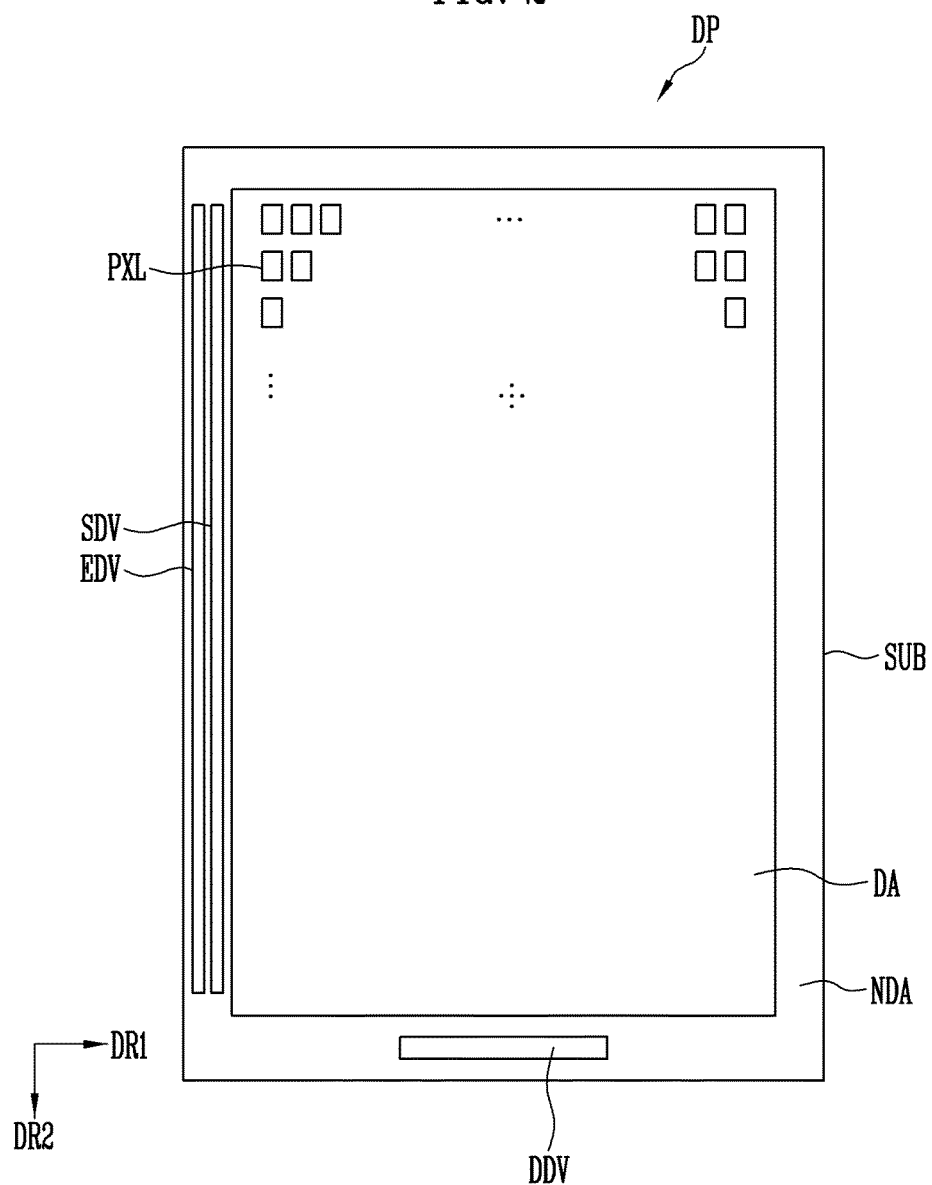
FIG. 2 is a plan view illustrating a display panel of the display device shown in FIG. 1.

FIG. 1 is a perspective view illustrating a display device according to an embodiment of the present disclosure. FIG. 2 is a plan view illustrating a display panel of the display device shown in FIG. 1.

Referring to FIGS. 1 and 2, the display device according to the embodiment of the present disclosure may be provided in various shapes. For example, the display device may be provided in a quadrangular plate shape having two pairs of sides parallel to each other. When the display device is provided in the rectangular plate shape, any one pair of sides among the two pairs of sides may be provided to be longer than the other pair of sides.

An embodiment of the present disclosure is illustrated where the display device has a pair of long sides and a pair of short sides. In this case, the extending direction of the short side is along a first direction DR1, and the extending direction of the long side is along a second direction DR2.

The display device may include a display panel DP, a touch sensor TS, and a window WD.

The display panel DP may display an image. The display panel DP is not particularly limited in how the image display may be achieved. For example, a self-luminescent display panel such as an organic light emitting display panel (OLED panel) may be used as the display panel DP.

Alternatively, a non-luminescent display panel such as a liquid crystal display panel (LCD panel), an electrophoretic display panel (EPD panel), or an electro-wetting display panel (EWD panel) may be used as the display panel DP.

When the non-luminescent display panel is used as the display panel DP, the display device may include a backlight unit for supplying light to the display panel DP. In the following embodiment, the OLED panel is used as the display panel DP.

The display panel DP may include a substrate SUB, pixels PXL, a driving unit, a power supply unit, and a line unit.

The substrate SUB may include a display region DA and a non-display region NDA.

The display region DA may be a region in which the pixels PXL for displaying an image are provided. The non-display region NDA is a region in which the pixels PXL are not provided, and may be a region in which the image is not displayed.

The non-display region NDA may be provided with the driving unit for driving the pixels PXL, the power supply unit for applying power to the pixels PXL, and some of lines (not shown) for connecting the pixels PXL and the driving unit.

The non-display area NDA may be provided at at least one side of the display area DA. In an embodiment of the present disclosure, the non-display area NDA may surround the circumference of the display region DA. In an embodiment of the present disclosure, the non-display region NDA may include a lateral part extending in the width direction thereof and a longitudinal part extending the length direction thereof. The longitudinal part of the non-display region NDA may be provided in a pair spaced apart from each other along the width direction of the display region DA.

The pixels PXL may be provided in the display region DA. Each pixel PXL is a unit for displaying an image, and a plurality of pixels PXL may be provided in the display region DA.

Each pixel PXL may include a display element for emitting light. For example, the display element may be any one of a liquid crystal display element (LCD element), an electrophoretic display element (EPD element), an electrowetting display device (EWD element), and an organic light emitting display element (OLED element). Meanwhile, hereinafter, a case where the OLED element is used as the display element is described as an example for convenience of description.

Each pixel PXL may emit light of any one color among red, green, and blue, but the present disclosure is not limited thereto. For example, the pixel PXL may emit light of any one color among cyan, magenta, yellow, and white. The pixels PXL may be arranged in a matrix form along rows extending in the first direction DR1 and columns extending in the second direction DR2 intersecting the first direction DR1. However, the arrangement form of the pixels PXL is not particularly limited, and the pixels PXL may be arranged in various other forms.

The driving unit provides a signal to each pixel PXL through the line unit, and accordingly, the driving of the pixel PXL can be controlled.

The driving unit may include a scan driver SDV for providing a scan signal to each pixel PXL through scan lines, an emission driver EDV for providing an emission control signal to each pixel PXL through emission control lines, a data driver DDV for providing a data signal to each pixel PXL through data lines, and a timing controller (not shown). The timing controller may control the scan driver SDV, the emission driver EDV, and the data driver DDV.

The scan driver SDV may be disposed at the longitudinal part in the non-display region NDA. Since the longitudinal part of the non-display region NDA is provided in a pair spaced apart from each other along the width direction of the display region DA, the scan driver SDV may be disposed at at least one of the longitudinal parts in the non-display region NDA. The scan driver SDV may extend lengthwise along the length direction of the non-display region NDA.

Like the scan driver SDV, the emission driver EDV may be disposed at the longitudinal part in the non-display region NDA. The emission driver EDV may be disposed at at least one of the longitudinal parts in the non-display region NDA. The emission driver EDV may extend lengthwise along the length direction of the non-display region NDA.

The data driver DDV may be disposed in the non-display region NDA. Particularly, the data driver DDV may be disposed at the lateral part of the non-display region NDA. The data driver DDV may extend lengthwise along the width direction of the non-display region NDA.

In an embodiment of the present disclosure, the positions of the scan driver SDV, the emission driver EDV, and/or the data driver DDV may be changed, if necessary.

The timing controller (not shown) may be connected in various manners to the scan driver SDV, the emission driver EDV, and the data driver DDV through lines. The position at which the timing controller is disposed is not particularly limited.

The power supply unit (not shown) may include at least one power supply line. For example, the power supply unit may include a first power supply line (not shown) and a second power supply line (not shown). The power supply unit may supply power to each of the pixels PXL arranged in the display region DA.

The touch sensor TS may be disposed on at least one of both surfaces of the display panel DP. For example, the touch sensor TS may be disposed on a surface of the display panel DP in the direction in which an image is emitted, such that the touch tensor TS may receive a touch input of a user. Also, the touch sensor TS may be integrally formed with the display panel DP, i.e. formed to be in contact the display panel DP. In an embodiment of the present disclosure, a case where the touch sensor TS is provided on an upper surface of the display panel DP is described as an example.

The touch sensor TS may recognize a touch event from the display device through a finger of a user or a separate input means. In an embodiment of the present disclosure, the touch sensor TS may be driven using a mutual capacitance method or a self-capacitance method. The touch sensor TS will be described later with reference to FIG. 3.

The window WD may be provided on the touch sensor TS.

The window WD may be made of a transparent material. The window WD may protect an exposed surface of the touch sensor TS.

The window WD allows an image from the display panel DP to be transmitted therethrough and simultaneously reduces impact from the outside, so that the display panel DP can be prevented from being damaged or erroneously operated due to the impact from the outside. The impact from the outside refers to a force from the outside of the display device, such as stress, which causes a defect of the display panel DP. A portion of or the entirety of the window WD may have flexibility.

Figure 3:
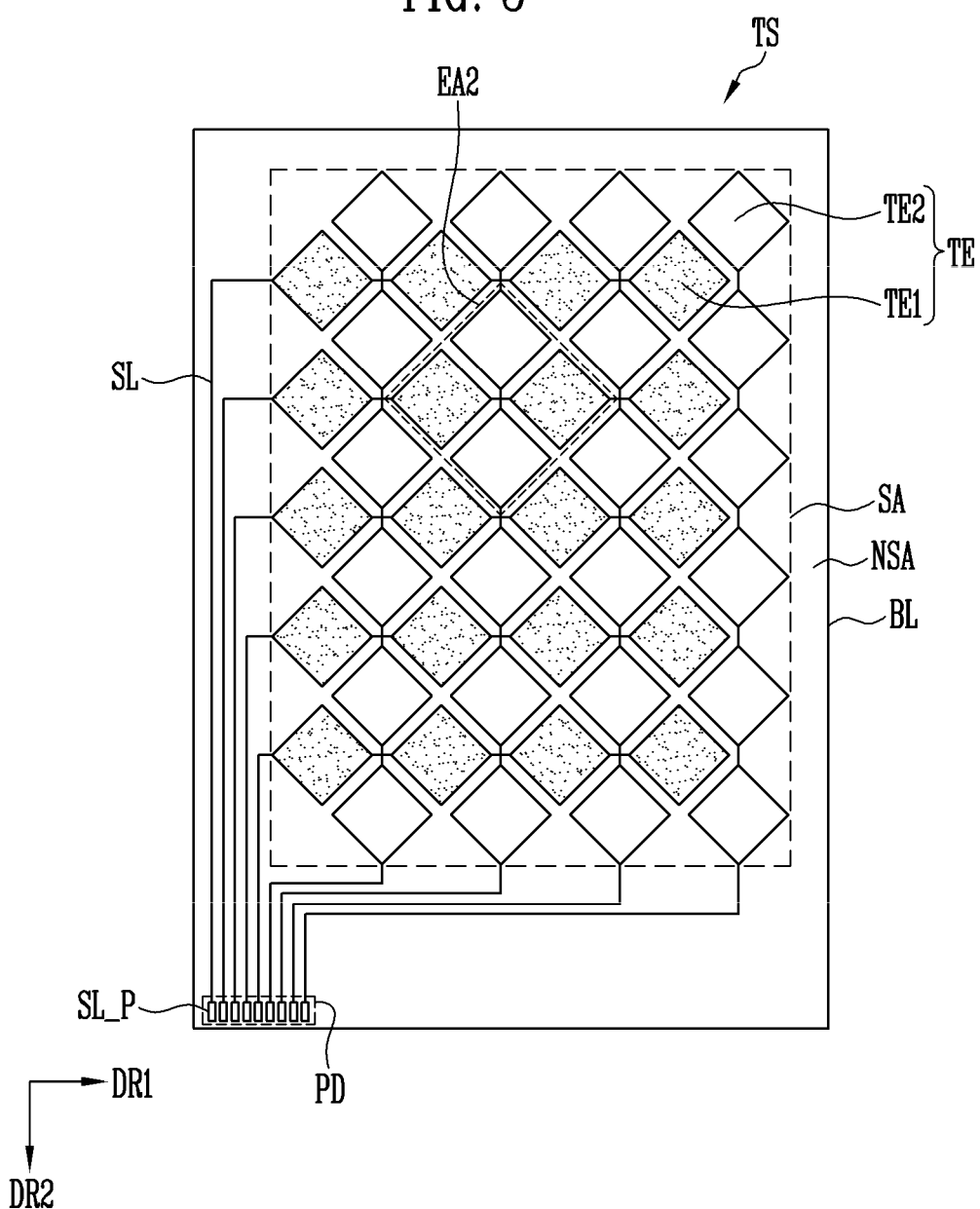
FIG. 3 is a plan view illustrating a touch sensor shown in FIG. 1.
Figure 4:
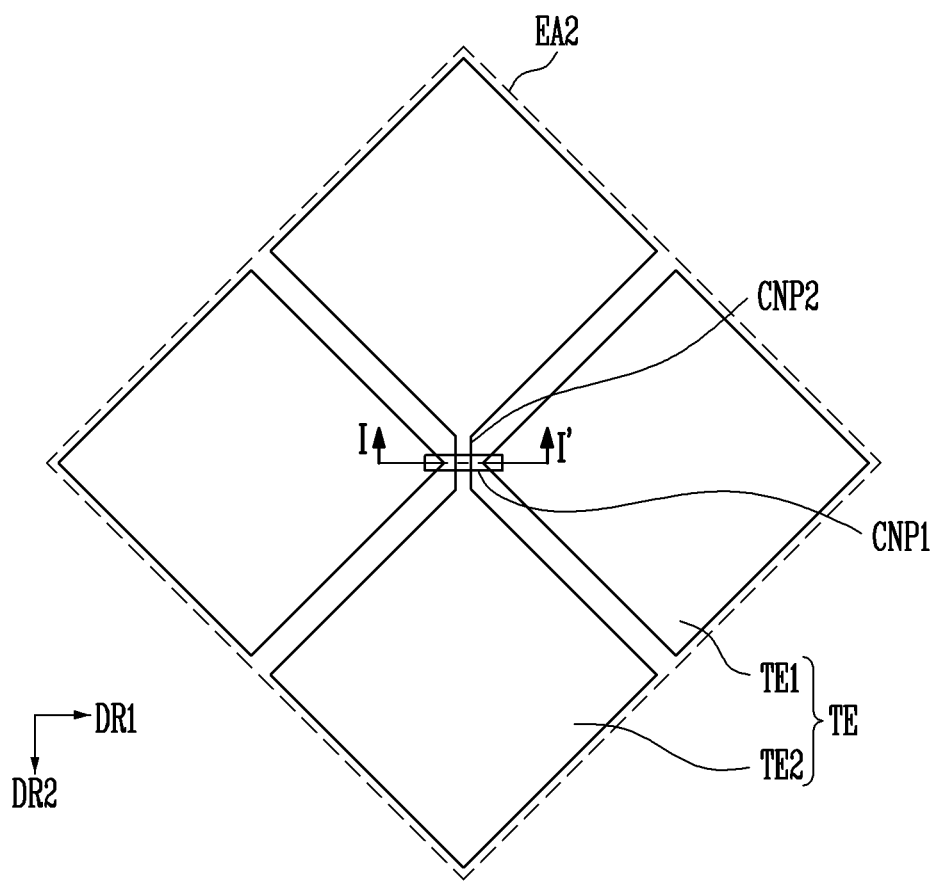
FIG. 4 is an enlarged view of region EA2 of FIG. 3.
Figure 5:
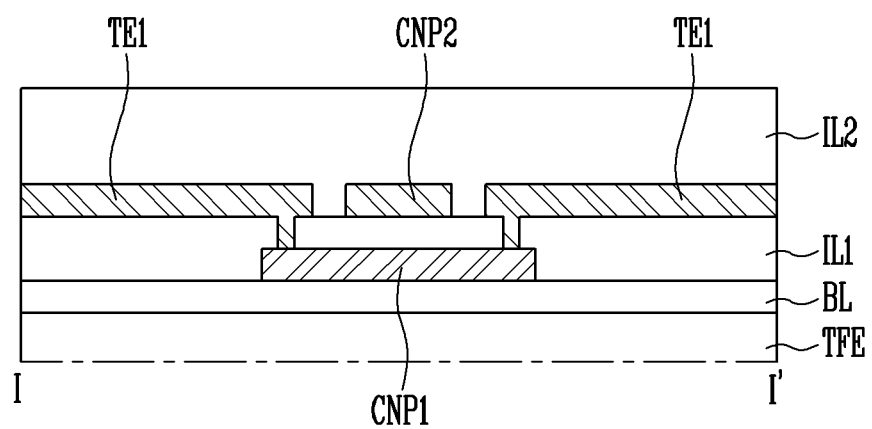
FIG. 5 is a sectional view taken along line I-I' of FIG. 4.

FIG. 3 is a plan view illustrating the touch sensor shown in FIG. 1. FIG. 4 is an enlarged view of region EA2 of FIG. 3. FIG. 5 is a sectional view taken along line I-I' of FIG. 4.

Referring to FIGS. 1 to 5, the touch sensor TS according to the embodiment of the present disclosure TS may include a base layer BL including a sensing region SA and a non-sensing region NSA.

The sensing region SA may overlap with the display region DA of the display panel DP, and be provided in a shape substantially identical to that of the display region DA. The non-sensing region NSA may overlap with the non-display region NDA of the display panel DP.

A plurality of touch electrodes TE may be provided in the sensing region SA, and sensing lines SL for connecting the touch electrodes TE to a pad unit PD may be provided in the non-sensing region NSA. The pad unit PD may include a plurality of pads SL_P. The pads SL_P may be electrically connected to corresponding touch electrodes TE through the sensing lines SL, respectively.

Some of the touch electrodes TE may be arranged in a first direction DR1 and be electrically connected to each other, to constitute a plurality of touch electrode rows parallel to each other. The touch electrodes TE included in the touch electrode rows may be first touch electrodes TE1. On the touch electrode rows, adjacent first touch electrodes TE1 may be electrically connected to each other through a first connection pattern CNP1.

In addition, the others of the touch electrodes TE may be arranged in a second direction DR2 and be electrically connected to each other, to constitute a plurality of touch electrode columns parallel to each other. The touch electrodes TE included in the touch electrode columns may be second touch electrodes TE2. On the touch electrode columns, adjacent second touch electrodes TE2 may be electrically connected to each other through a second connection pattern CNP2.

Each of the touch electrode rows and the touch electrode columns may be electrically connected to the pad unit PD through a corresponding sensing line SL.

One of the first touch electrode TE1 and the second touch electrode TE2 may receive a driving signal for touch sensing through a corresponding sensing line SL, and the other of the first touch electrode TE1 and the second touch electrode TE2 may transfer a touch sensing signal through a corresponding sensing line SL.

In an embodiment of the present disclosure, the touch sensor TS may recognize a touch of a user by sensing a change in mutual capacitance formed between the first touch electrode TE1 and the second touch electrode TE2.

The touch sensor TS may include a first conductive layer provided on the base layer BL, a first insulating layer IL1 covering the first conductive layer, a second conductive layer provided on the first insulating layer IL1, and a second insulating layer IL2 covering the second conductive layer.

The base layer BL may be provided on a thin film encapsulation layer TFE of the display panel DP. The base layer BL may include an organic insulating layer made of an organic material or an inorganic insulating layer made of an inorganic material.

The first conductive layer may include at least one of the first touch electrode TE1, the second touch electrode TE2, the first connection pattern CNP1, and the second connection pattern CNP2. For example, the first conductive layer may include the first connection pattern CNP1.

The first conductive layer may include a conductive material. The conductive material may include a transparent conductive oxide and/or a metallic material. Also, the first conductive layer may include a plurality of stacked metal layers. Examples of the transparent conductive oxide may be indium tin oxide (ITO), indium zinc oxide (IZO), antimony zinc oxide (AZO), indium tin zinc oxide (ITZO), zinc oxide (ZnO), tin oxide (SnO$_2$), and/or the like. Examples of the metallic material may be copper, silver, gold, platinum, palladium, nickel, tin, aluminum, cobalt, rhodium, iridium, iron, ruthenium, osmium, manganese, molybdenum, tungsten, niobium, tantalum, titanium, bismuth, antimony, lead, and/or the like.

The first insulating layer IL1 may be disposed on the base layer BL on which the first conductive layer including the first connection pattern CNP1 is provided. The first insulating layer IL1 may include the same material as the base layer BL, but the present disclosure is not limited thereto. In an embodiment of the present disclosure, the first insulating layer IL1 may include at least one of the organic insulating layer and the inorganic insulating layer.

Like the first conductive layer, the second conductive layer may include a single conductive material layer, or include a plurality of stacked conductive material layers. The second conductive layer may include at least one of the first touch electrode TE1, the second touch electrode TE2, the first connection pattern CNP1, and the second connection pattern CNP2. In an embodiment of the present disclosure, the second conductive layer may include the first touch electrode TE1, the second touch electrode TE2, and the second connection pattern CNP2.

The second insulating layer IL2 may be provided on the first insulating layer IL1 on which the second conductive layer is provided. The second insulating layer IL2 may prevent corrosion of the second conductive layer by preventing the second conductive layer from being exposed to the outside of the display device.

The second insulating layer IL2 may be configured as an organic insulating layer made of an organic material. The organic material may include one of acryl, polyimide (PI), polyamide (PA), and benzochclobutene (BCB). Since the second insulating layer IL2 configured as the organic insulating layer is transparent and flexible, the second insulating layer IL2 may reduce winding of a lower structure.

In an embodiment of the present disclosure, although a case where the first connection pattern CNP1 is included in the first conductive layer and the second connection pattern CNP2 is included in the second conductive layer is described as an example, the present disclosure is not limited thereto. For example, the second connection pattern CNP2 may be included in the first conductive layer, and the first connection pattern CNP1 may be included in the second conductive layer.

Also, in an embodiment of the present disclosure, although a case where the first conductive layer is provided on the base layer BL and the second conductive layer is provided on the first insulating layer IL1 is described as an example, the present disclosure is not limited thereto. For example, the first conductive layer may be provided on the first insulating layer IL1, and the second conductive layer may be provided on the base layer BL.

Also, in an embodiment of the present disclosure, although a case where the first touch electrode TE1 and the second touch electrode TE2 are provided on the same layer is described as an example, the present disclosure is not limited thereto. For example, the first touch electrode TE1 and the second touch electrode TE2 may be provided on different layers.

Although not shown in the drawings, the first touch electrode TE1 and the second touch electrode TE2 may be formed in a mesh structure including a plurality of conductive fine lines.

Figure 6:
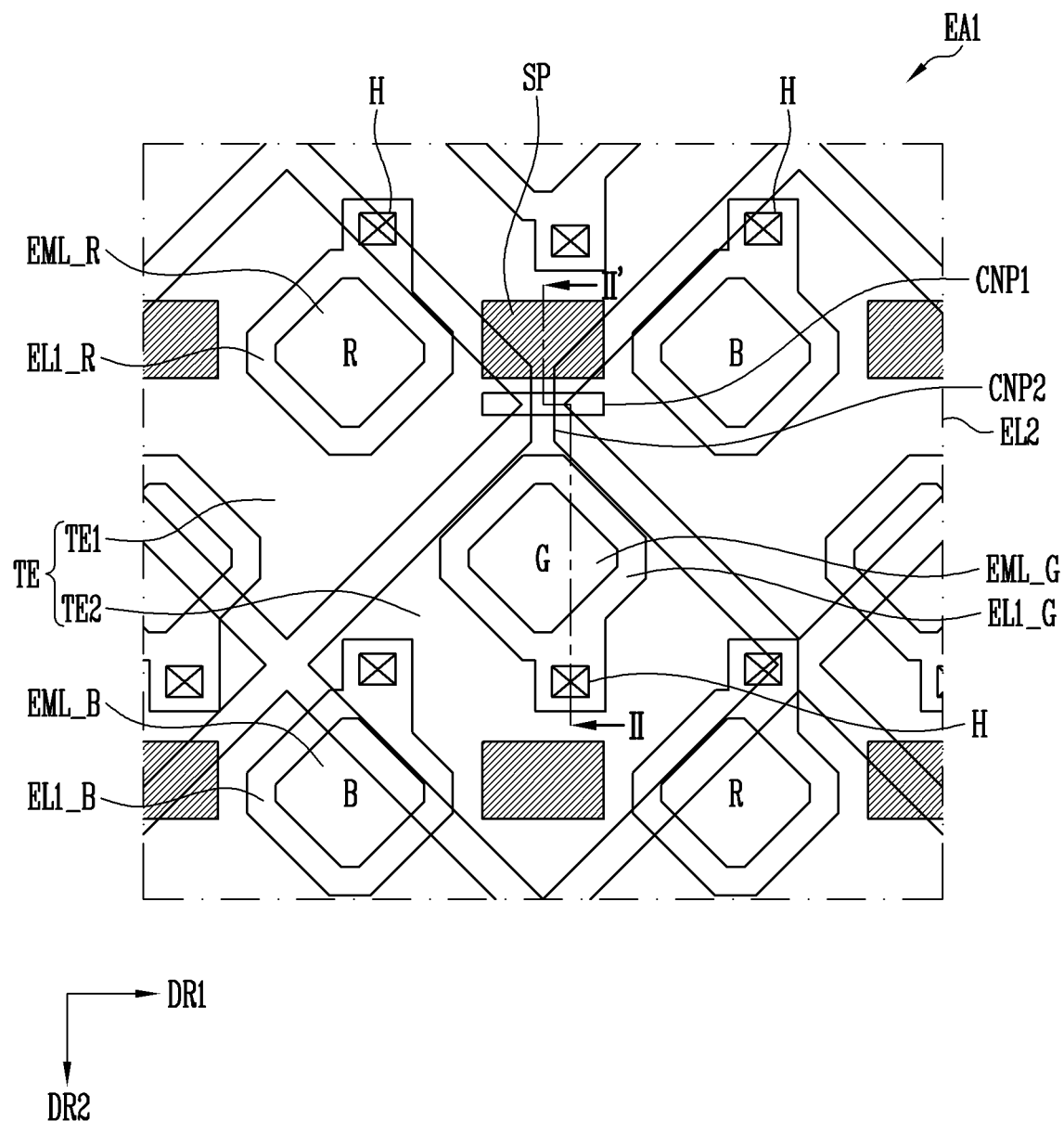
FIG. 6 is an enlarged view of region EA1 of FIG. 1.
Figure 7:
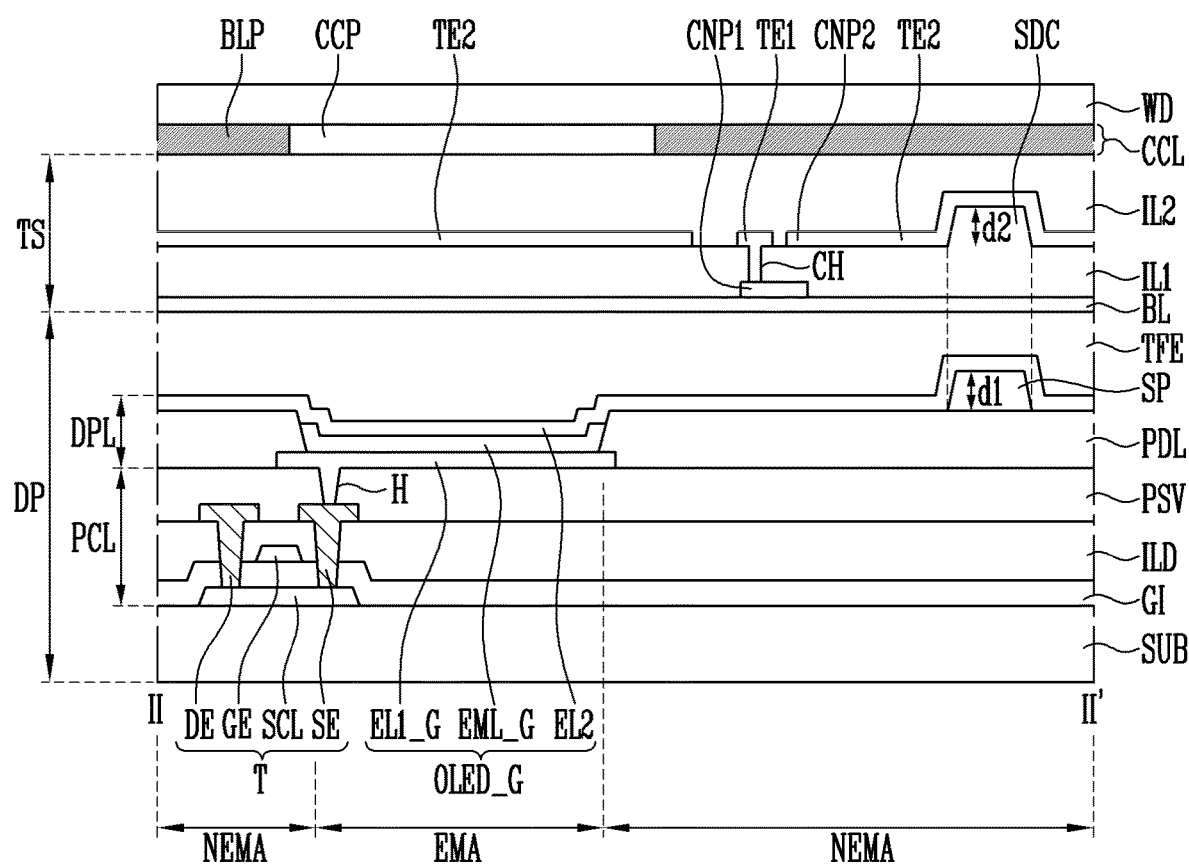
FIG. 7 is a sectional view taken along line II-II' of FIG. 6.
Figure 8A:
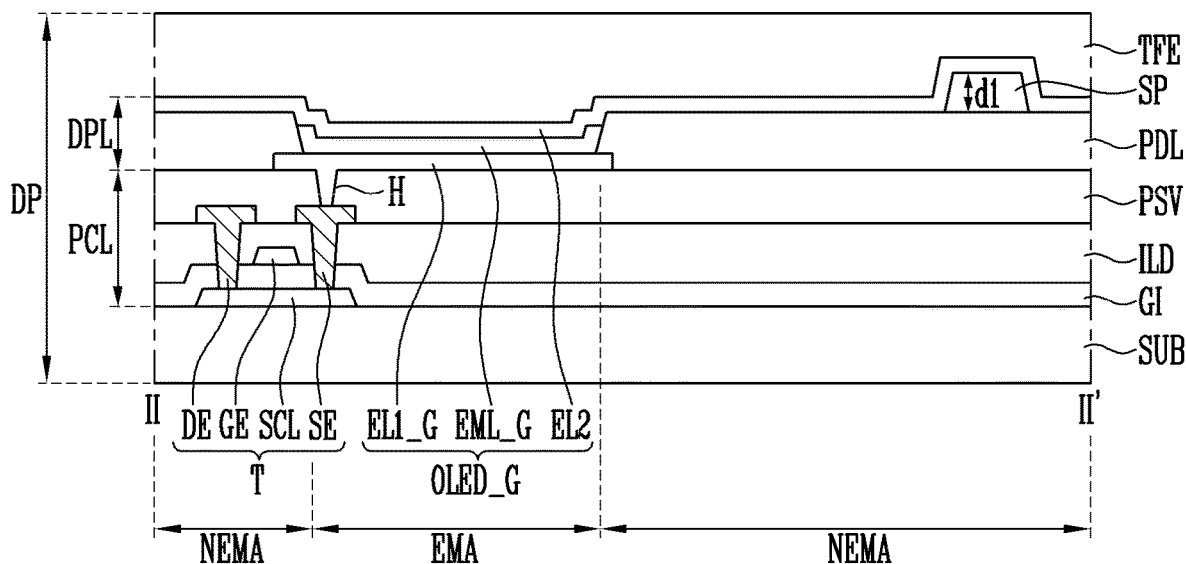
FIGS. 8A, 8B, 8C, 8D, 8E, 8F, 8G, and 8H are sectional views sequentially illustrating a fabricating method of the display device of FIG. 7.
Figure 8B:
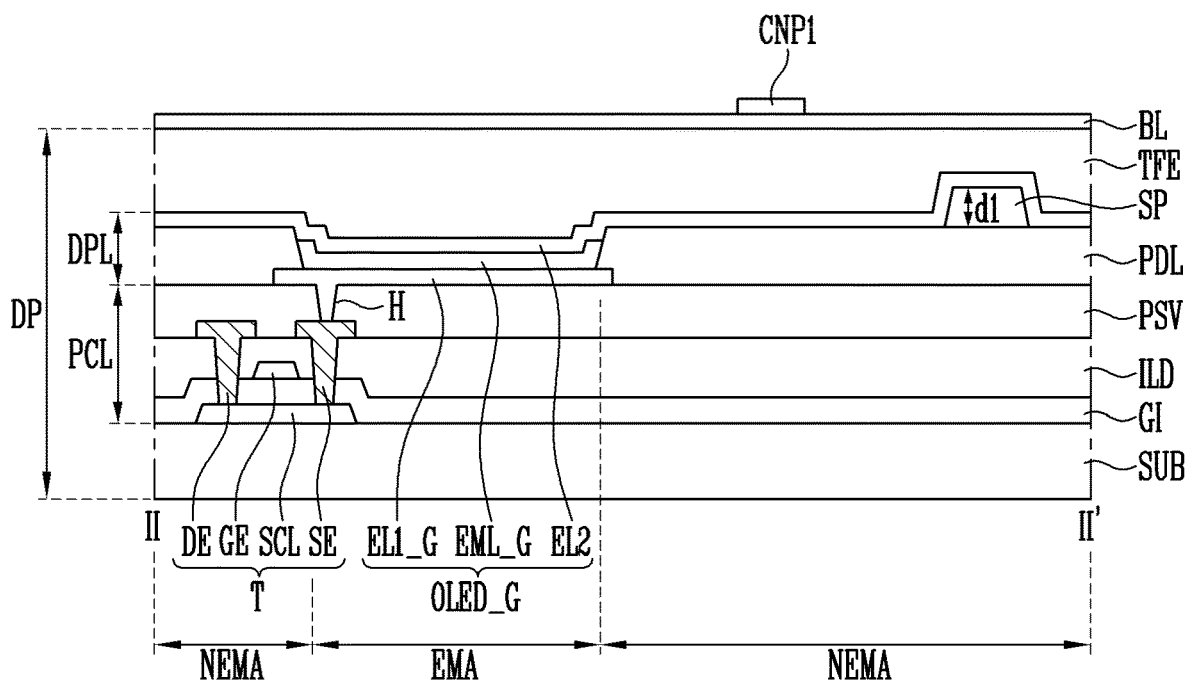
Figure 8C:
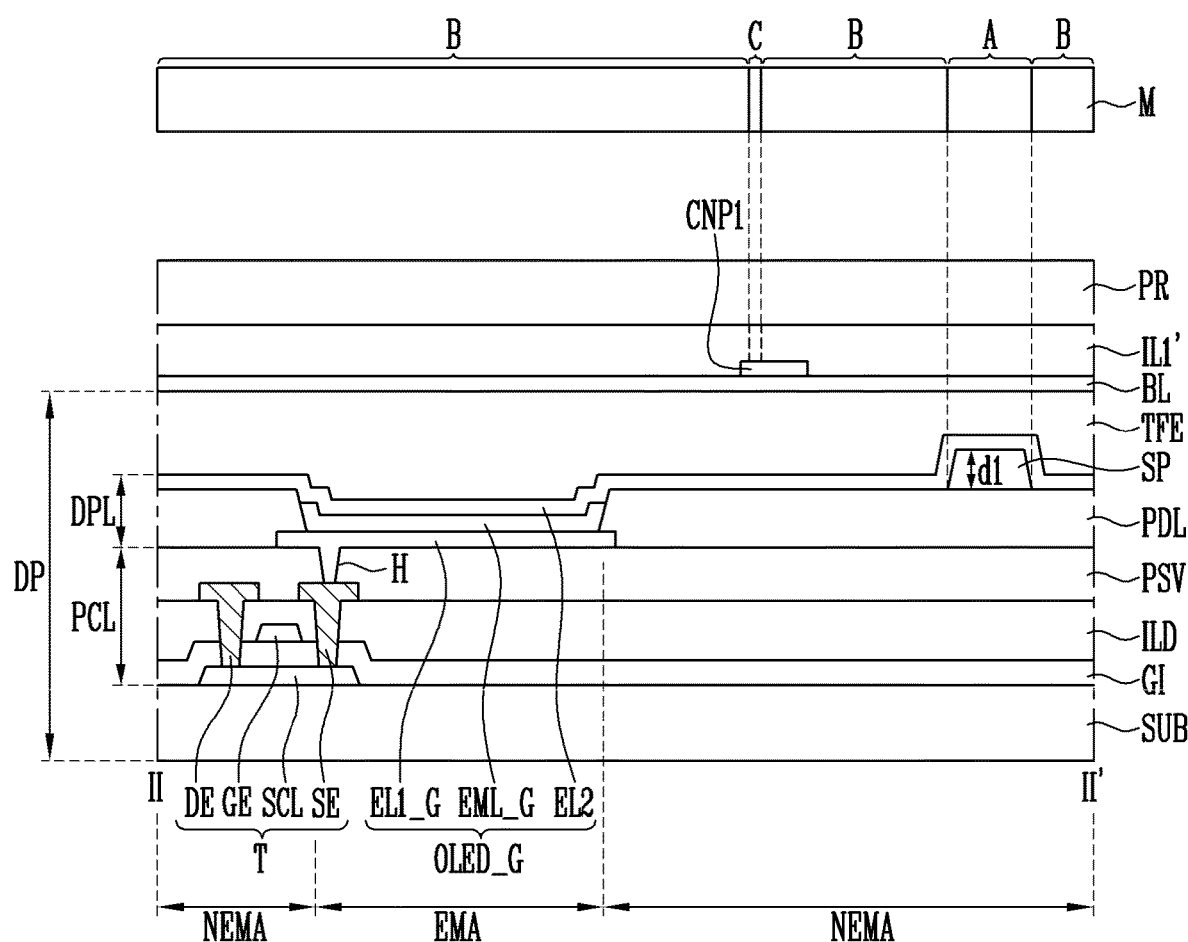
Figure 8D:
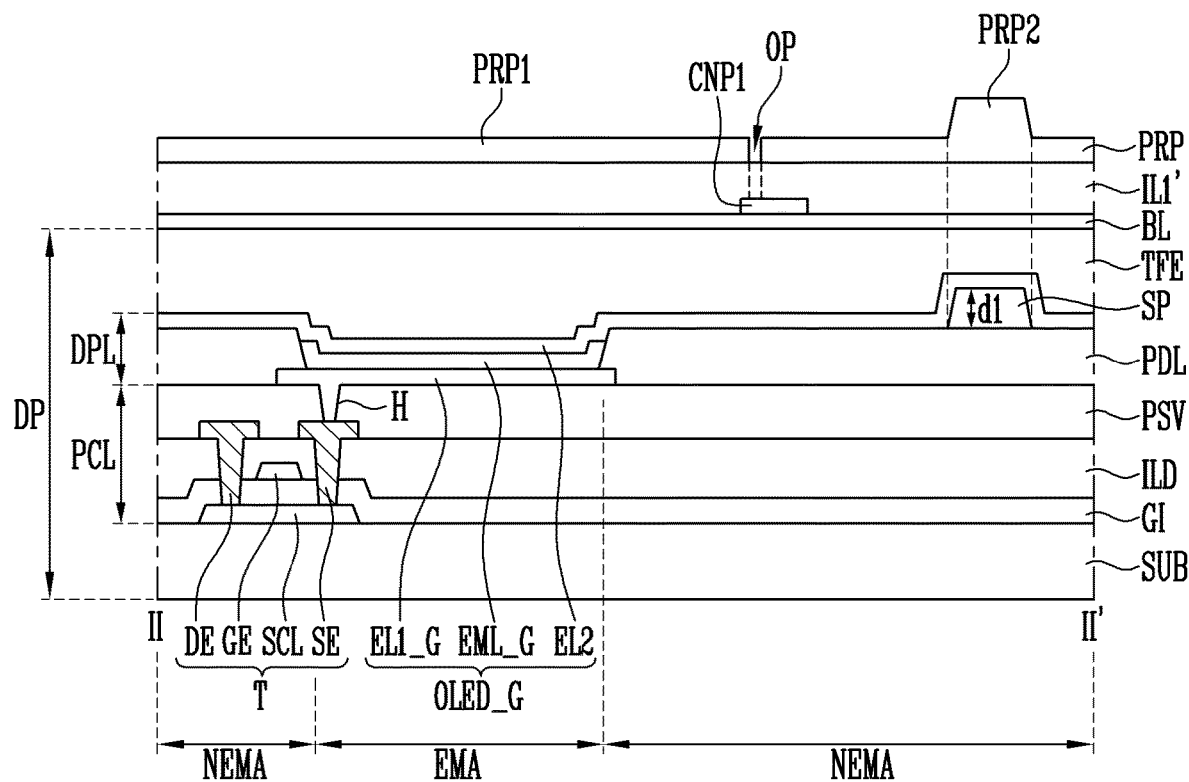
Figure 8E:
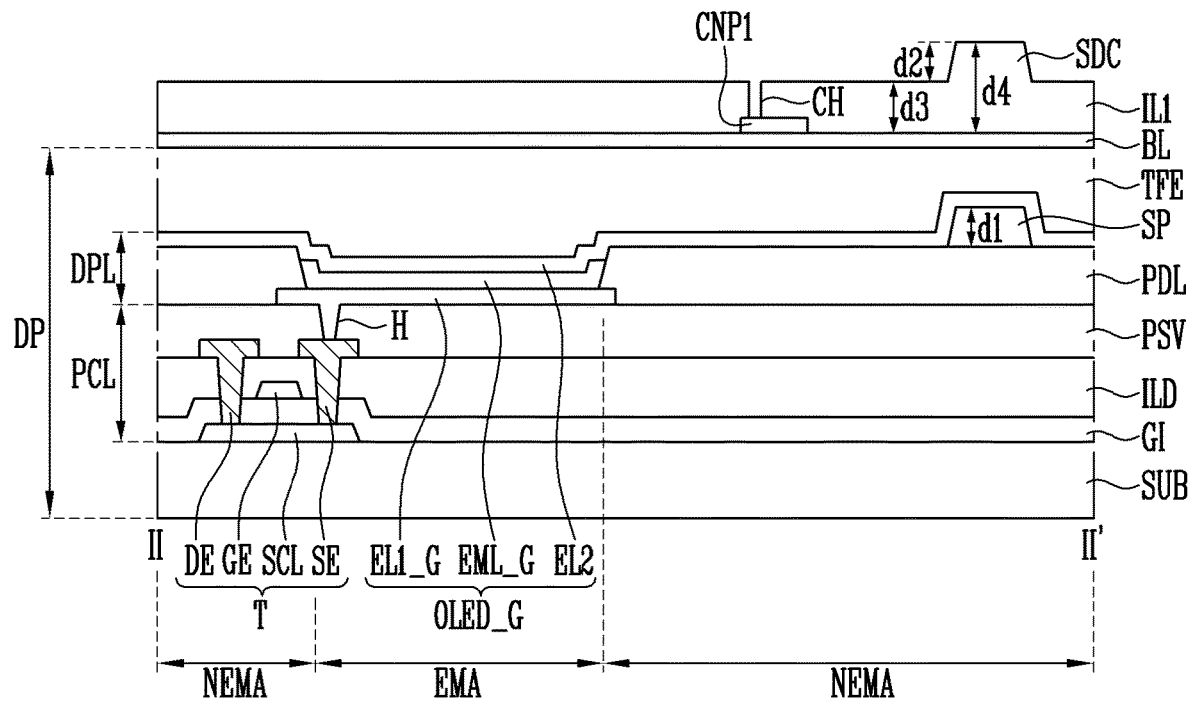
Figure 8F:
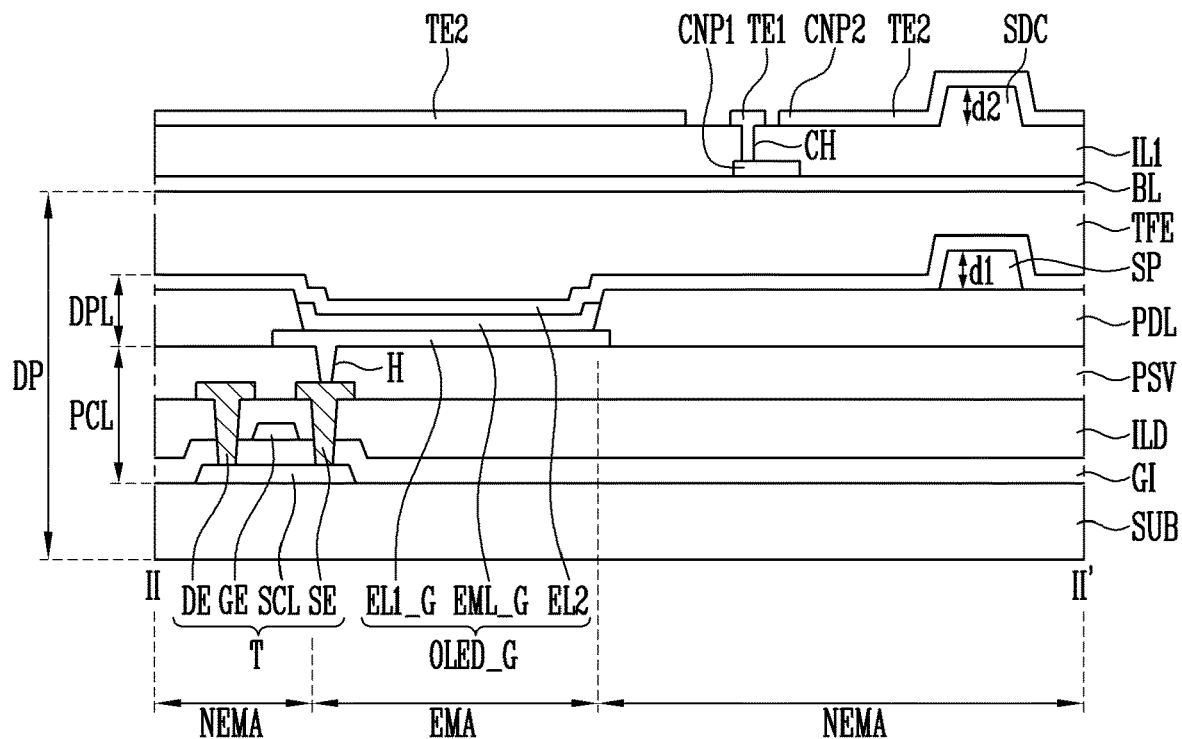
Figure 8G:
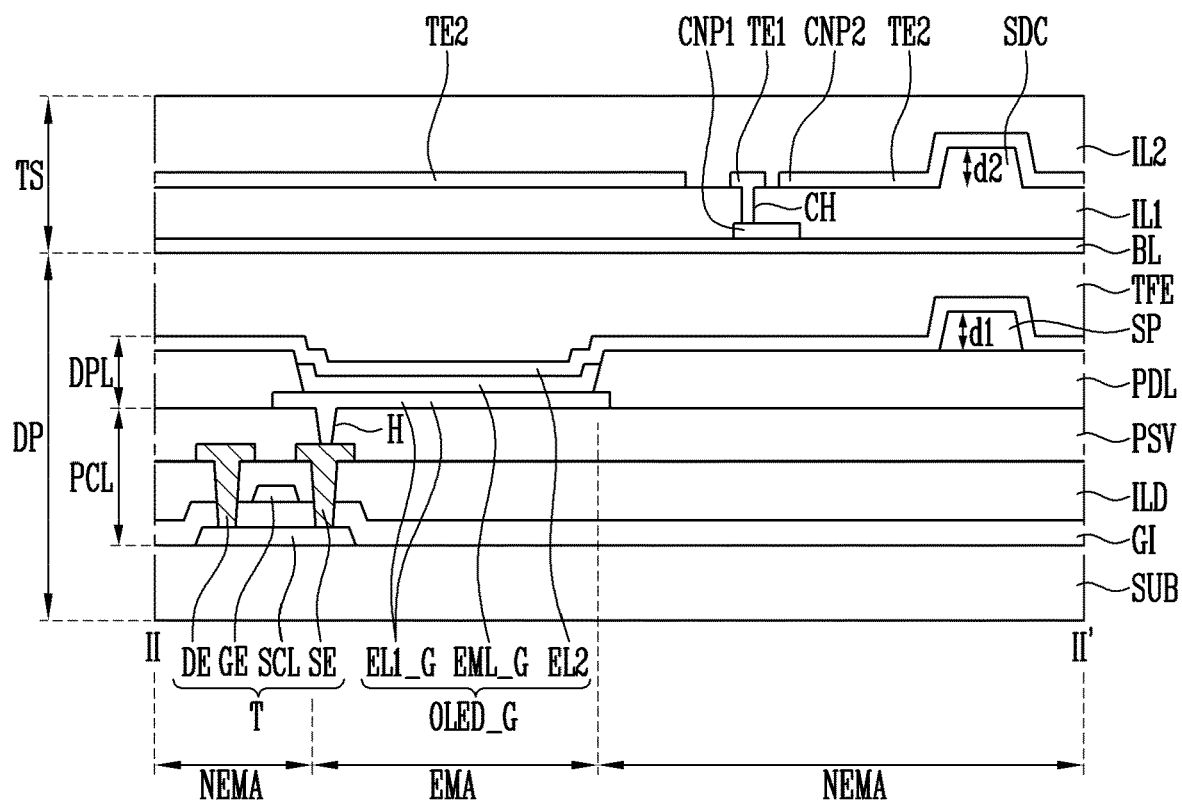
Figure 8H:
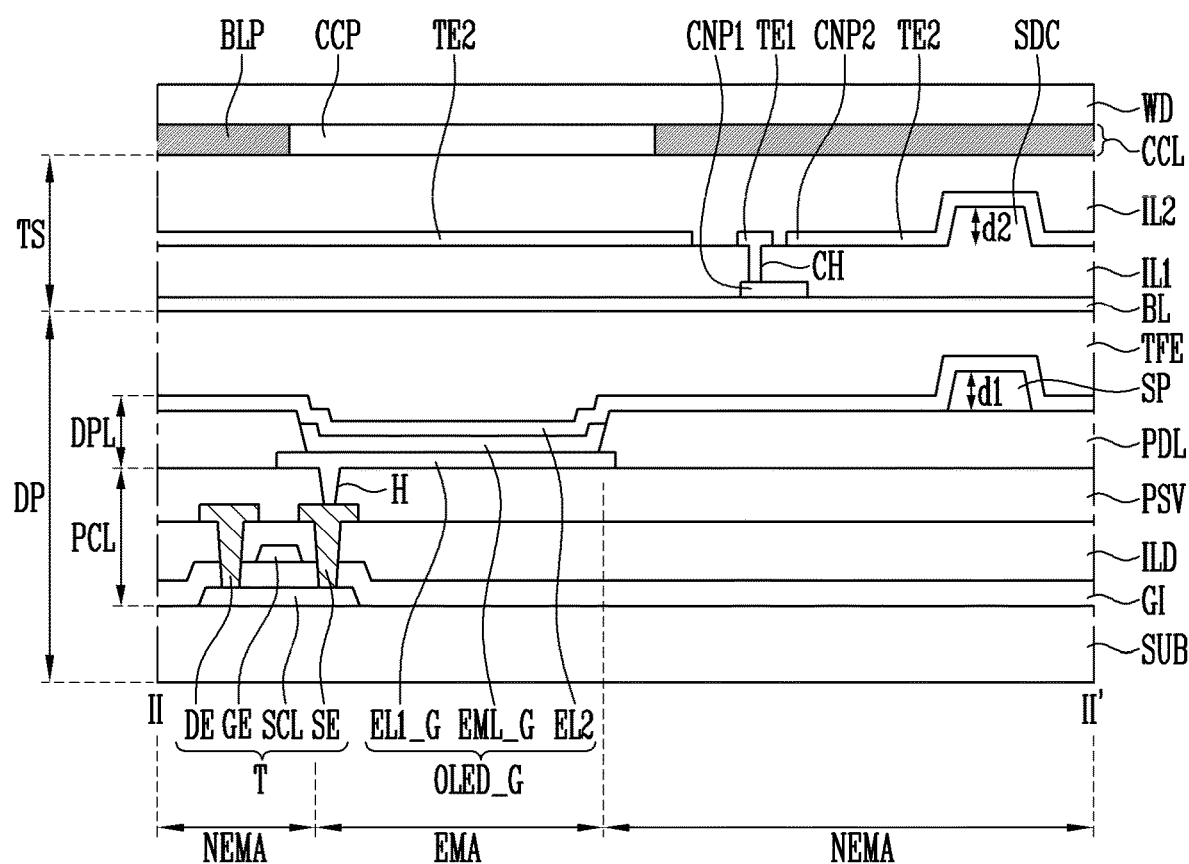

FIG. 6 is an enlarged view of region EA1 of FIG. 1. FIG. 7 is a sectional view taken along line II-II' of FIG. 6.

In FIG. 6, illustration of lines connected to a plurality of pixels is omitted for convenience of depiction.

Referring to FIGS. 1 to 7, the display device according to the embodiment of the present disclosure may include a display panel DP, a touch sensor TS provided on the display panel DP, and a window WD provided on the touch sensor TS.

The display panel DP may include a substrate SUB on which a plurality of pixels PXL are provided as well as a thin film encapsulation layer TFE provided on the substrate SUB.

The substrate SUB may include a transparent insulating material to enable light to be transmitted therethrough. The substrate SUB may be a rigid substrate or a flexible substrate. The rigid substrate may include a glass substrate, a quartz substrate, a glass ceramic substrate, and a crystalline glass substrate. The flexible substrate may include a film substrate and a plastic substrate, which include a polymer organic material.

The pixels PXL may include a first pixel R, a second pixel G, and a third pixel B, which emits lights having different colors from each other. In an embodiment of the present disclosure, the first pixel R may include a red pixel emitting red light, the second pixel G may include a green pixel emitting green light, and the third pixel B may include a blue pixel emitting blue light.

Each of the first to third pixels R, G, and B may include a pixel circuit unit PCL and a display element layer DPL having a light emitting element connected to the pixel circuit unit PCL.

The pixel circuit unit PCL may include at least one transistor T provided on the substrate SUB and a protective layer PSV provided over the transistor T.

The transistor T may include a semiconductor layer SCL, a gate electrode GE, a source electrode SE, and a drain electrode DE.

The semiconductor layer SCL may be provided on the substrate SUB. The semiconductor layer SCL may include a source region and a drain region, which are in contact with the source electrode SE and the drain electrode DE, respectively. A region between the source region and the drain region may be a channel region.

The semiconductor layer SCL may be a semiconductor pattern made of poly-silicon, amorphous silicon, oxide semiconductor, etc. The channel region may be a semiconductor pattern doped with an impurity. The impurity may include impurities such as an n-type impurity, a p-type impurity, and other metals.

The gate electrode GE may be provided on the semiconductor layer SCL with a gate insulating layer GI interposed therebetween.

The source electrode SE and the drain electrode DE, which are included in the transistor T, may be connected to the source region and the drain region of the semiconductor layer SCL through contact holes penetrating an interlayer insulating layer ILD and the gate insulating layer GI, respectively.

The protective layer PSV may cover the transistor T and protect the transistor T.

The display element layer DPL may include light emitting elements respectively corresponding to the first to third pixels R, G, and B, a pixel defining layer PDL, and spacers SP.

The light emitting element of the first pixel R may include a first electrode EL1_R for the first pixel, an emitting layer EML_R for the first pixel that emits the red light, and a second electrode EL2 provided on the emitting layer EML_R for the first pixel. The second electrode EL2 may be commonly provided throughout the first to third pixels R, G, and B.

The first electrode EL1_R for the first pixel may be connected to a pixel circuit unit PCL of the first pixel R through a first pixel contact hole H.

The light emitting element OLED_G of the second pixel G (hereinafter, referred to as a 'second light emitting element') may include a first electrode EL1_G for the second pixel, an emitting layer EML_G for the second pixel that emits the green light, and the second electrode EL2 provided on the emitting layer EML_G for the second pixel.

The first electrode EL1_G for the second pixel may be connected to a transistor T provided in the pixel circuit unit PCL of the second pixel G through a second pixel contact hole H.

The light emitting element of the third pixel B may include a first electrode EM1_B for the third pixel, an emitting layer EML_B for the third pixel that emits the blue light, and the second electrode EL2 provided on the emitting layer EML_B for the third pixel.

The first electrode EM1_B for the third pixel may be connected to a pixel circuit unit PCL of the third pixel B through a third pixel contact hole H.

In an embodiment of the present disclosure, the first electrode EL1_R for the first pixel, the first electrode EM1_G for the second pixel, and the first electrode EM1_B for the third pixel may be anode electrodes, and the second electrode EL2 may be a cathode electrode.

When the light emitting element of the first pixel R, the second light emitting element OLED_G, and the light emitting element of the third pixel B are top-emission organic light emitting elements, the first electrode EL1_R for the first pixel, the first electrode EL1_G for the second pixel, and the first electrode EL1_B for the third pixel may be reflective electrodes. The second electrode EL2 may be a transmissive electrode.

The substrate SUB may include emission regions EMA respectively corresponding to the light emitting element of the first pixel R, the second light emitting element OLED_G, and the light emitting element of the third pixel B, and a non-emission region NEMA that does not include any portion of the emission regions EMA.

The pixel defining layer PDL may protrude from the substrate SUB along the circumference of the first to third pixels R, G, and B. The pixel defining layer PDL may include openings that respectively expose a portion of the first electrode EL1_R for the first pixel, a portion of the first electrode EL1_G for the second pixel, and a portion of the first electrode EL1_B for the third pixel.

The pixel defining layer PDL may define the emission region EMA and the non-emission region NEMA with respect to each of the first to third pixels R, G, and B. The pixel defining layer PDL may include an organic insulating layer made of an organic material. For example, the pixel defining layer PDL may include at least one of polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane based resin, and silane based resin.

The spacer SP may be provided in the non-emission region NEMA. The spacer SP is provided in a shape protruding between the pixel defining layer PDL and the second electrode EL2, to maintain a constant distance from the base layer BL of the touch sensor TS.

The spacer SP may include the same material as the pixel defining layer PDL, and be integrally provided with the pixel defining layer PDL. The spacer SP is provided to allow characteristics of the light emitting element of the first pixel R, the second light emitting element OLED_G, and the light emitting element of the third pixel B to not be deteriorated due to external impact. The spacers SP may be regularly or irregularly disposed in the display region DA.

The second electrode EL2 may be provided on a corresponding emitting layer in the emission region EMA, and be provided on the pixel defining layer PDL and the spacer SP in the non-emission region NEMA.

Since the thickness of the second electrode EL2 is very thin, the second electrode EL2 may be influenced by shapes of components disposed on the bottom thereof. In particular, the second electrode EL2 may be influenced by shapes of the spacer SP and the pixel defining layer PDL in the non-emission region NEMA.

The non-emission region NEMA may be divided into a region (hereinafter, referred to as a 'first region') that corresponds to the spacer SP and an other region (hereinafter, referred to as a 'second region') that does not correspond to the spacer SP.

The second electrode EL2 may have a flat surface in the second region, and have a protruding surface corresponding to the shape of the spacer SP in the first region. That is, in the first region, the second electrode EL2 may have a step difference caused by a thickness d1 of the spacer SP.

The thin film encapsulation layer TFE may be provided over the second electrode EL2.

In one embodiment the thin film encapsulation layer TFE may be provided in a single layer, but in another embodiment the thin film encapsulation layer TFE may be provided in a multi-layer. The thin film encapsulation layer TFE may include a plurality of insulating layers that cover the light emitting element of the first pixel R, the second light emitting element OLED_G, and the light emitting element of the third pixel B.

Specifically, the thin film encapsulation layer TFE may include a plurality of inorganic layers and a plurality of organic layers. For example, the thin film encapsulation layer TFE may have a structure in which the inorganic layers and the organic layers are alternately stacked. In some cases, the thin film encapsulation film TFE may be an encapsulating substrate that is joined together with the substrate SUB through a sealant.

The touch sensor TS may be provided on the thin film encapsulation layer TFE.

The touch sensor TS may include a base layer BL including a sensing region SA and a non-sensing region NSA, and a touch electrode TE provided on the base layer BL.

The base layer BL is disposed between the touch electrode TE and the second electrode EL2, to constantly maintain a distance between the touch electrode TE and the second electrode EL2. Accordingly, the occurrence of a parasitic capacitance between the touch electrode TE and the second electrode EL2 can be minimized.

The base layer BL may block a liquid (e.g., a developer, etchant, or the like) used in a fabricating process of the touch electrode TE or moisture from the outside of the display device from being introduced into the emitting layer corresponding to each of the first to third pixels R, G, and B.

In an embodiment of the present disclosure, the base layer BL may be configured as an organic insulating layer including an organic material, but the present disclosure is not limited thereto. For example, the base layer BL may be an inorganic insulating layer including an inorganic material.

The touch electrode TE may include first touch electrodes TE1 consecutively arranged in a first direction DR1, and second touch electrodes TE2 consecutively arranged in a second direction DR2 intersecting the first direction DR1.

Also, the touch electrode TE may include a first connection pattern CNP1 that connects one first touch electrode TE1 to an adjacent first touch electrode TE1, and a second connection pattern CNP2 that connects one second touch electrode TE2 to an adjacent second touch electrode TE2.

The touch sensor TS may further include a first insulating layer IL1 and a second insulating layer IL2.

The first insulating layer IL1 may be provided over the first connection pattern CNP1. The first insulating layer IL1 may include a touch contact hole CH that exposes a portion of the first connection pattern CNP1 and an insulating pattern SDC disposed to correspond to the spacer SP.

The first insulating layer IL1 may include an organic insulating layer made of an organic material or an inorganic insulating layer made of an inorganic material.

The insulating pattern SDC may be provided in a shape protruding toward the window WD from a surface of the first insulating layer IL1, and be disposed in the non-emission layer NEMA. Specifically, the insulating pattern SDC may be disposed in the first region of the non-emission region NEMA.

The insulating pattern SDC may be designed to have a thickness d2 equal to a thickness d1 of the spacer SP. In an embodiment of the present disclosure, the insulating pattern SDC may be integrally provided with the first insulating layer IL1, and include the same material as the first insulating layer IL1. That is, the insulating pattern SDC may include an organic insulating layer made of an organic material or an inorganic insulating layer made of an inorganic material.

Since the first insulating layer IL1 includes the insulating pattern SDC, a thickness of the first insulating layer IL1 corresponding to the first region may be larger than that of the first insulating layer IL1 corresponding to the second region.

In an embodiment of the present disclosure, the first touch electrode TE1, the second touch electrode TE2, and the second connection pattern CNP2 may be provided on the first insulating layer IL1.

The first touch electrode TE1 may be provided on the first insulating layer IL1 to be connected to the first connection pattern CNP1 through the touch contact hole CH.

As shown in FIG. 7, the second touch electrode TE2 may be provided on the insulating pattern SDC in the first region, and be provided on the first insulating layer IL1 in the second region.

The second touch electrode TE2 may be influenced by shapes of the first insulating layer IL1 and the insulating pattern SDC, which are disposed on the bottom thereof.

The second touch electrode TE2 may have a flat surface in the second region, and have a protruding surface corresponding to the shape of the insulating pattern SDC in the first region. That is, in the first region, the second touch electrode TE2 may have a step difference caused by the thickness d2 of the insulating pattern SDC.

In an embodiment of the present disclosure, since the thickness d2 of the insulating pattern SDC is equal to a thickness d1 of the spacer SP, the second touch electrode TE2 may have a surface protruding identically to the protruding surface of the second electrode EL2 in the first region.

When the second touch electrode TE2 has the protruding surface, the distance between the second touch electrode TE2 and the second electrode EL2 in the first region may be secured to a certain level or more. For example, the distance between the second electrode EL2 and the second touch electrode TE2 in the first region may be equal or similar to that between the second electrode EL2 and the second touch electrode TE2 in the second region.

When the insulating pattern SDC does not exist, the second touch electrode TE2 has a flat surface in the first and second regions. A difference in distance between the second touch electrode TE2 and the second electrode EL2 in the first and second regions may occur.

Specifically, since the second electrode EL2 has the protruding surface in the first region, the distance between the second electrode EL2 and the second touch electrode TE2 in the first region may be narrower than that between the second electrode EL2 and the second touch electrode TE2 in the second region.

When the distance between the second electrode EL2 and the second touch electrode TE2 decreases, the capacitance of a parasitic capacitor increases. Hence, the capacitance of a parasitic capacitor formed in the first region may be larger than that of a parasitic capacitor formed in the second region.

The difference in distance between the second touch electrode TE2 and the second electrode EL2 in the first and second regions may cause a difference between the capacitances of the parasitic capacitors in the first and second regions. Therefore, the touch sensor TS cannot implement a uniform touch recognition rate.

In an embodiment of the present disclosure, the insulating pattern SDC having the same thickness as the spacer SP is disposed, so that the distances between the second electrode EL2 and the second touch electrode TE2 in the first and second regions are equal or similar to each other. That is, the insulating pattern SDC may be a step compensation part for compensating for a step difference of the second electrode EL2, which occurs due to the spacer SP in the first region.

As described above, when the distances between the second electrode EL2 and the second touch electrode TE2 in the first and second regions are equal or similar to each other, the touch sensor TS can implement a uniform touch recognition rate throughout the entire region.

The window WD may protect an exposed surface of the touch sensor TS. The window WD allows an image from the display panel DP to be transmitted therethrough and simultaneously reduces impact from the outside, so that the display panel DP can be prevented from being damaged or erroneously operated due to the impact from the outside.

The display device may further include a color conversion layer CCL provided between the touch sensor TS and the window WD.

The color conversion layer CCL may include a color conversion pattern CCP and a light blocking pattern BLP.

The light blocking pattern BLP may be disposed between adjacent color conversion pattern CCP to prevent mixture of colors of the adjacent color conversion patterns CCP. Also, the light blocking pattern BLP may absorb light incident on the display device from the outside to prevent the light from being incident on components disposed at the bottom of the color conversion layer CCL.

Although light incident from the outside is reflected by the components, a portion of the light is absorbed by the light blocking pattern BLP, so that the components can be prevented from being viewed from the outside.

In an embodiment of the present disclosure, the light blocking pattern BLP may include a black matrix. However, the present disclosure is not limited thereto, and the light blocking pattern BLP may be made of materials including a material for blocking light.

The color conversion pattern CCP may be provided to correspond to the emission region EMA, and include a color filter that allows only light having a preset wavelength to pass therethrough. Accordingly, although light is incident into the display device from the outside, the light is blocked by the color filter not to be incident on the components disposed at the bottom of the color conversion layer CCL.

FIGS. 8A to 8H are sectional views sequentially illustrating a fabricating method of the display device of FIG. 7.

Referring to FIGS. 1 to 8A, a pixel circuit unit PCL and a display element layer DPL are formed on a substrate SUB including an emission region EMA and a non-emission region NEMA.

A buffer layer (not shown) may be provided between the substrate SUB and a transistor T. The buffer layer may prevent an impurity from being diffused into the transistor T. In one embodiment, the buffer layer may be provided in a single layer, but in another embodiment the buffer layer may be provided in a multi-layer having at least two layers.

The pixel circuit unit PCL may include the transistor T and a protective layer PSV covering the transistor T.

The display element layer DPL may include a pixel defining layer PDL, a spacer SP, and a second light emitting element OLED_G.

The second light emitting element OLED_G may include a first electrode EL1_G for a second pixel, an emitting layer EML_G for the second pixel, and a second electrode EL2, and the second electrode EL2 may have a protruding surface in a region corresponding to the spacer SP.

A thin film encapsulation layer TFE is formed on the display element layer DPL.

Referring to FIGS. 1 to 8B, a base layer BL is formed on the thin film encapsulation layer TFE. Subsequently, a first connection pattern CNP1 is formed on the base layer BL.

Referring to FIGS. 1 to 8C, an insulating material layer IL1' is formed on the base layer including the first connection pattern CNP1.

Subsequently, a photoresist layer PR is formed on the insulating material layer IL1', and a halftone mask M is then disposed on the photoresist layer PR. The halftone mask M may include a light blocking region A, a light transmission region C, and a semi-transmission region B.

Referring to FIGS. 1 to 8D, a photoresist pattern PRP is formed by exposing and etching the photoresist layer PR through a mask process using the halftone mask M.

The photoresist pattern PRP may include first and second photoresist patterns PRP1 and PRP2. Also, the photoresist pattern PRP may include an opening OP that exposes a portion of the insulating material layer IL1' corresponding to the first connection pattern CNP1.

The first photoresist pattern PRP1 may correspond to the semi-transmission region B of the halftone mask M, and the second photoresist pattern PRP2 may correspond to the light blocking region A of the halftone mask M. The opening OP may correspond to the light transmission region of the halftone mask M.

The first photoresist pattern PRP1 may have a thickness thinner than that of the second photoresist pattern PRP2.

Referring to FIGS. 1 to 8E, a first insulating layer IL1 is formed by selectively etching the insulating material layer IL1, using the photoresist pattern PRP as a mask.

The first insulating layer IL1 may be divided into a region corresponding to the first photoresist pattern PRP1 and a region corresponding to the second photoresist pattern PRP2.

A thickness d3 of the first insulating layer IL1 corresponding to the first photoresist pattern PRP1 may be thinner than that d4 of the first insulating layer IL1 corresponding to the second photoresist pattern PRP2. This is because the first insulating layer IL1 is not etched by the second photoresist pattern PRP2, or is etched to a small degree.

In the first insulating layer IL1, a portion corresponding to the second photoresist pattern PRP2 may protrude further than that corresponding to the first photoresist pattern PRP1. The protruding portion in the insulating layer IL1 may be an insulating pattern SDC.

In an embodiment of the present disclosure, the insulating pattern SDC may be designed to have a thickness d2 equal to a thickness d1 of the spacer SP.

The first insulating layer IL1 may include a touch contact hole CH corresponding to the opening OP.

Referring to FIGS. 1 to 8F, a first touch electrode TE1, a second touch electrode TE2, and a second connection pattern CNP2 are formed on the first insulating layer IL1 including the insulating pattern SDC.

The first touch electrode TE1 may be connected to the first connection pattern CNP1 through the touch contact hole CH of the first insulating layer IL1.

The second touch electrode TE2 may be integrally provided with the second connection pattern CNP2. The second touch electrode TE2 may have a protruding surface in a region corresponding to the insulating pattern SDC.

Referring to FIGS. 1 to 8G, a second insulating layer IL2 is formed over the first and second touch electrodes TE1 and TE2 and the second connection pattern CNP2.

The second insulating layer IL2 covers the first and second touch electrodes TE1 and TE2 and the second connection pattern CNP2, to prevent the first and second touch electrodes TE1 and TE2 and the second connection pattern CNP2 from being exposed to the outside.

Referring to FIGS. 1 to 8H, a color conversion layer CCL including a light blocking pattern BLP and a color conversion pattern CCP is formed on the second insulating layer IL2.

Subsequently, a window WD is formed on the color conversion layer CCL.

Figure 9:
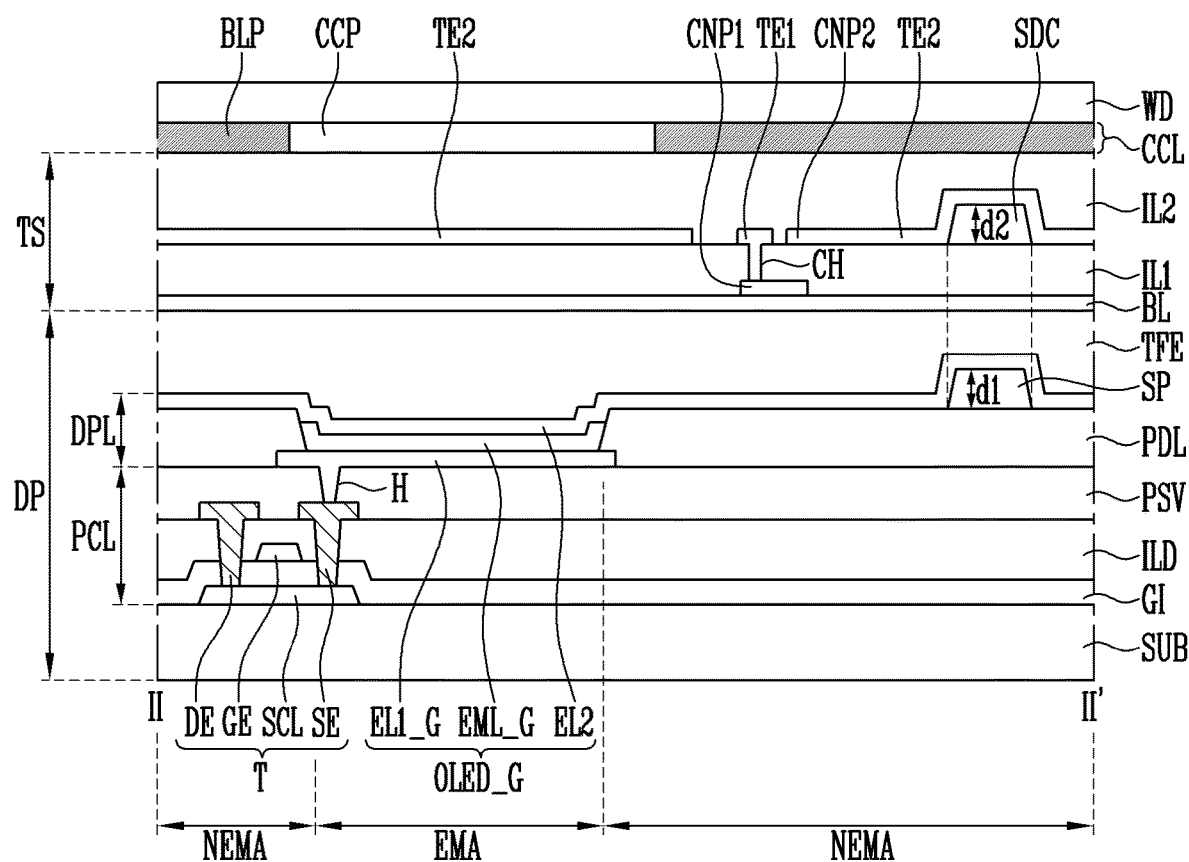
FIG. 9 is a sectional view taken along the line II-II' of FIG. 6 illustrating a display device according to another embodiment of the present disclosure.

FIG. 9 illustrates a display device according to another embodiment of the present disclosure, which is a sectional view taken along the line II-II' of FIG. 6.

In the another embodiment of the present disclosure different from the above-described embodiment, portions different from those of the above-described embodiment will be mainly described to avoid redundancy. Portions not particularly described in this embodiment follow those of the above-described embodiment. In addition, identical reference numerals refer to identical components, and similar reference numerals refer to similar components.

Referring to FIGS. 6 and 9, the display device according to the another embodiment of the present disclosure may include a display panel DP, a touch sensor TS, and a window WD.

The display panel DP may include a substrate SUB, a pixel circuit unit PCL, a display element layer DPL, and a thin film encapsulation layer TFE.

The pixel circuit unit PCL may include a transistor T.

The display element layer DPL may include a pixel defining layer PDL, a spacer SP, and a second light emitting element OLED_G.

The second light emitting element OLED_G may include a first electrode EL1_G for a second pixel, an emitting layer EML_G for the second pixel, and a second electrode EL2.

The substrate SUB may include an emission region EMA corresponding to the emitting layer EML_G for the second pixel and a non-emission region NEMA that does not include any portion of the emission region EMA.

The spacer SP may be provided in the non-emission region NEMA.

In an embodiment of the present disclosure, the non-emission region NEMA may be divided into a first region that corresponds to, i.e. that overlaps with, the spacer SP and a second region that does not correspond to, i.e. that does not overlap with, the spacer SP.

The second electrode EL2 may have a flat surface in the second region, and have a protruding surface corresponding to the shape of the spacer SP in the first region.

The touch sensor TS may include a base layer BL, a touch electrode TE, a first insulating layer IL1, an insulating pattern SDC, and a second insulating layer IL2.

The touch electrode TE may include first and second touch electrodes TE1 and TE2 and first and second connection patterns CNP1 and CNP2.

The first insulating layer IL1 may be provided on the base layer BL on which the first connection pattern CNP1 is provided. The first insulating layer IL1 may include an organic insulating layer made of an organic material or an inorganic insulating layer made of an inorganic material.

The insulating pattern SDC may be provided in the first region on the first insulating layer IL1. That is, the insulating pattern SDC may be provided in the first region to correspond to the spacer SP.

In an embodiment of the present disclosure, the insulating pattern SDC may include a material different from that of the first insulating layer IL1. For example, when the first insulating layer IL1 includes an inorganic insulating layer, the insulating pattern SDC may include an organic insulating layer. Also, when the first insulating layer IL1 includes an organic insulating layer, the insulating pattern SDC may include an inorganic insulating layer.

However, the present disclosure is not limited thereto, and the insulating pattern SDC may include the same material as the first insulating layer IL1.

The insulating pattern SDC may have a thickness d2 equal to a thickness d1 of the spacer SP.

The first touch electrode TE1 and the second connection pattern CNP2 may be provided on the first insulating layer IL1.

The second touch electrode TE2 may be provided on the first insulating layer IL1 in the second region, and be provided on the insulating pattern SDC in the first region. The second touch electrode TE2 may have a flat surface in the second region, and have a protruding surface corresponding to the shape of the insulating pattern SDC in the first region.

As the second touch electrode TE2 has the protruding surface, the distance between the second touch electrode TE2 and the second electrode EL2 in the first region may be secured to a certain level or more. For example, the distance between the second electrode EL2 and the second touch electrode TE2 in the first region may be equal or similar to that between the second electrode EL2 and the second touch electrode TE2 in the second region.

As described above, when the distances between the second electrode EL2 and the second touch electrode TE2 in the first and second regions are equal or similar to each other, the touch sensor TS can implement a uniform touch recognition rate throughout the entire region.

Figure 10:
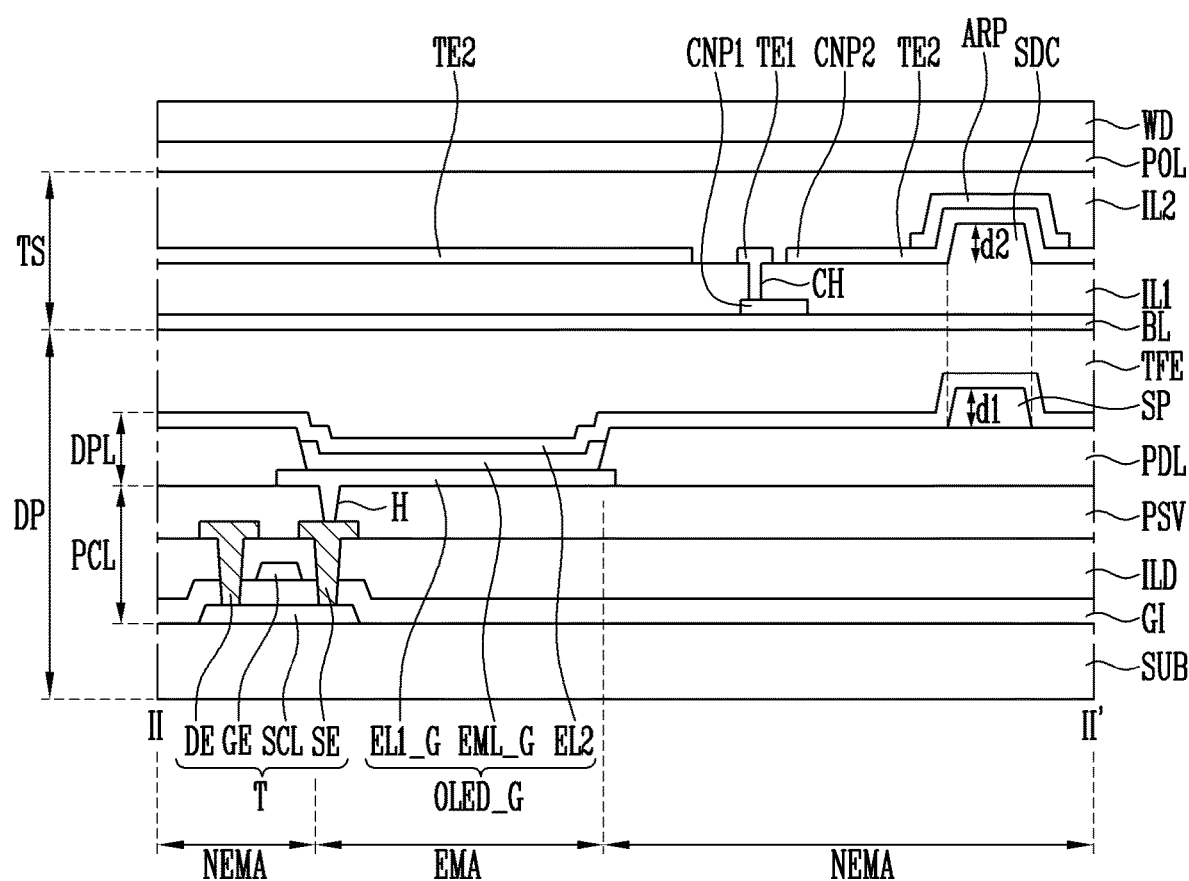
FIG. 10 is a sectional view taken along the line II-II' of FIG. 6 illustrating a display device according to still another embodiment of the present disclosure.

FIG. 10 illustrates a display device according to still another embodiment of the present disclosure, which is a sectional view taken along the line II-II' of FIG. 6.

In the still another embodiment of the present disclosure different from above-described embodiment, portions different from those of the above-described embodiment will be mainly described to avoid redundancy. Portions not particularly described in this embodiment follow those of the above-described embodiment. In addition, identical reference numerals refer to identical components, and similar reference numerals refer to similar components.

The display device shown in FIG. 10 may have a configuration substantially identical or similar to that of the display device of FIGS. 6 and 7, except that an anti-reflection layer is provided on an insulating pattern, and a polarizing film is provided between a window and a touch sensor.

Referring to FIGS. 6 and 10, the display device according to the still another embodiment of the present disclosure may include a display panel DP, a touch sensor TS, a polarizing film POL and a window WD.

The display panel DP may include a substrate SUB, a pixel circuit unit PCL, a display element layer DPL, and a thin film encapsulation layer TFE.

The pixel circuit unit PCL may include a transistor T.

The display element layer DPL may include a pixel defining layer PDL, a spacer SP, and a second light emitting element OLED_G.

The second light emitting element OLED_G may include a first electrode EL1_G for a second pixel, an emitting layer EML_G for the second pixel, and a second electrode EL2.

The substrate SUB may include an emission region EMA corresponding to the emitting layer EML_G for the second pixel and a non-emission region NEMA not including the emission region EMA.

The spacer SP may be provided in the non-emission region NEMA.

In an embodiment of the present disclosure, the non-emission region NEMA may be divided into a first region that corresponds to the spacer SP and a second region that does not correspond to the spacer SP.

The second electrode EL2 may have a flat surface in the second region, and have a protruding surface corresponding to the shape of the spacer SP in the first region.

The touch sensor TS may include a base layer BL, a touch electrode TE, a first insulating layer IL1, an insulating pattern SDC, an anti-reflection pattern ARP, and a second insulating layer IL2.

The touch electrode TE may include first and second touch electrodes TE1 and TE2 and first and second connection patterns CNP1 and CNP2.

The first insulating layer IL1 may be provided over the first connection pattern CNP1. The first insulating layer IL1 may include a touch contact hole CH that exposes a portion of the first connection pattern CNP1 and an insulating pattern SDC disposed to correspond to the spacer SP.

The first insulating IL1 may include an organic insulating layer made of an organic material or an inorganic insulating layer made of an inorganic material.

The insulating pattern SDC may be provided in a shape protruding toward the window WD from a surface of the first insulating layer IL1, and be disposed in the first region. The insulating pattern SDC may have a thickness d2 equal to a thickness d1 of the spacer SP.

In an embodiment of the present disclosure, the insulating pattern SDC may be integrally provided with the first insulating layer IL1, but the present disclosure is not limited thereto.

For example, the insulating pattern SDC may be provided as a component separate from the first insulating layer IL1. The insulating pattern SDC may be provided on the first insulating layer IL1 after the first insulating layer IL1 is formed.

The first touch electrode TE1 and the second connection pattern CNP2 may be provided on the first insulating layer IL1.

The second touch electrode TE2 may be provided on the first insulating layer IL1 in the second region, and be provided on the insulating pattern SDC in the first region. The second touch electrode TE2 may have a flat surface in the second region, and have a protruding surface corresponding to the shape of the insulating pattern SDC in the first region.

As the second touch electrode TE2 has the protruding surface, the distance between the second touch electrode TE2 and the second electrode EL2 in the first region may be secured to a certain level or more. For example, the distance between the second electrode EL2 and the second touch electrode TE2 in the first region may be equal or similar to that between the second electrode EL2 and the second touch electrode TE2 in the second region.

The anti-reflection pattern ARP may be provided over the insulating pattern SDC in the first region. The anti-reflection pattern ARP may include a black matrix made of an organic material or a conductive material for absorbing light.

The second touch electrode having the protruding surface in the first region is covered by the anti-reflection pattern ARP, and thus the second touch electrode TE2 can be prevented from being viewed from the outside.

The polarizing film POL has a polarizing axis, and may linearly polarizing light in a direction vertical to the polarizing axis. For example, the polarizing film POL may allow light parallel to the polarizing axis to be absorbed therein, and allow light vertical to the polarizing axis to pass therethrough. Therefore, when the light passes through the polarizing film POL, the light may be linearly polarized in a direction vertical to the polarizing axis.

The polarizing film POL absorbs light parallel to the polarizing axis among lights that are introduced into, reflected, and emitted from the display device, so that the external light reflectability of the display device can be reduced.

The display device according to the embodiment of the present disclosure can be employed in various electronic devices. For example, the display device is applicable to televisions, notebook computers, cellular phones, smart phones, smart pads, PMPs, PDAs, navigations, various wearable devices such as smart watches, and the like.

According to the present disclosure, there can be provided a display device having a touch sensor for implementing a uniform touch recognition rate and a fabricating method of the display device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A display device comprising:
   a substrate including an emission region and a non-emission region;
   at least one transistor disposed on the substrate;
   a display element layer including a light emitting element disposed to correspond to the emission region and a spacer disposed to correspond to the non-emission region; and
   a touch sensor disposed on the display element layer,
   wherein the touch sensor includes a plurality of touch electrodes provided in a sensing region, an insulating pattern disposed to correspond to the spacer, and a base layer including the sensing region and a non-sensing region and, in a region between the insulating pattern and the spacer, the base layer does not protrude toward any of the plurality of touch electrodes,
   wherein the insulating pattern and the spacer have a same thickness,
   wherein some of the plurality of touch electrodes are disposed on the insulating pattern.

2. The display device of claim 1, wherein the insulating pattern includes an organic insulating layer or an inorganic insulating layer.

3. The display device of claim 2, wherein the touch sensor further includes an insulating layer covering some of the plurality of touch electrodes.

4. The display device of claim 3, wherein the insulating pattern is integrally provided with the insulating layer.

5. The display device of claim 3, wherein, in the insulating layer, a thickness of a region that corresponds to the spacer is larger than a thickness of an other region that does not correspond to the spacer.

6. The display device of claim 3, wherein the touch electrodes include:
   a touch electrode row including a plurality of first touch electrodes extending along a first direction;
   a touch electrode column including a plurality of second touch electrodes extending along a second direction intersecting the first direction;
   a first connection pattern connecting one first touch electrode to an adjacent first touch electrode; and
   a second connection pattern connecting one second touch electrode to an adjacent second touch electrode,
   wherein the first touch electrodes, the second touch electrodes, and the second connection pattern are disposed on the first connection pattern with the insulating layer interposed therebetween.

7. The display device of claim 6, wherein at least one of the first touch electrodes, the second touch electrodes, and the second connection pattern is disposed on the insulating pattern to have a protruding surface.

8. The display device of claim 6, wherein the insulating pattern is disposed on the insulating layer.

9. The display device of claim 8, wherein the insulating pattern and the insulating layer include different materials.

10. The display device of claim 8, wherein the insulating pattern and the insulating layer include a same material.

11. The display device of claim 6, wherein the display element layer further includes a pixel defining layer disposed between adjacent emission regions,
    wherein the spacer is disposed on the pixel defining layer.

12. The display device of claim 11, wherein the light emitting element includes:
    a first electrode connected to the transistor;
    an emitting layer disposed on the first electrode; and
    a second electrode disposed on the emitting layer,
    wherein the second electrode has a protruding surface in a region corresponding to the spacer.

13. The display device of claim 7, further comprising a color conversion layer disposed on the touch sensor.

14. The display device of claim 7, further comprising a polarizing film disposed on the touch sensor.

15. The display device of claim 14, further comprising an anti-reflection pattern disposed over the insulating pattern.

16. A method of fabricating display device, the method comprising:
    preparing a substrate including an emission region and a non-emission region;
    forming at least one transistor on the substrate;
    forming a display element layer on the substrate, wherein the display element layer includes the at least one transistor, a light emitting element disposed to correspond to the emission region, and a spacer disposed to correspond to the non-emission region; and
    forming a touch sensor on the display element layer,
    wherein the forming of the touch sensor includes:
    preparing a base layer including a sensing region and a non-sensing region;
    forming a first connection pattern on the base layer;
    forming, over the first connection pattern, an insulating layer including an insulating pattern disposed to correspond to the spacer; and
    forming, on the insulating layer, first touch electrodes extending along a first direction, second touch electrodes extending along a second direction intersecting the first direction, and a second connection pattern connecting one second touch electrode to an adjacent second touch electrode,
    wherein some of the second touch electrodes are disposed on the insulating pattern, and
    wherein, in a region between the insulating pattern and the spacer, the base layer does not protrude toward any first and second touch electrodes.

17. The method of claim 16, wherein the insulating pattern and the spacer have a same thickness.

18. The method of claim 17, wherein the forming of the insulating layer includes:
    forming an insulating material layer on the base layer including the first connection pattern;
    forming, using a halftone mask, a photoresist layer on the insulating material layer and then forming a photoresist pattern in which a thickness of a region that corresponds to the spacer is thicker than a thickness of a region that does not correspond to the spacer; and
    etching the insulating material layer using the photoresist pattern as a mask,
    wherein, in the insulating layer, a region that corresponds to the spacer has a shape protruding further in a vertical direction than a region that does not correspond to the spacer,
    wherein the insulating pattern includes a shape protruding from the insulating layer.

19. The method of claim 18, wherein the insulating pattern and the insulating layer are integrally provided.

20. The method of claim 18, wherein the insulating pattern includes an organic insulating layer or an inorganic insulating layer.

* * * * *